(12) United States Patent
Maitra et al.

(10) Patent No.: US 7,759,205 B1
(45) Date of Patent: Jul. 20, 2010

(54) METHODS FOR FABRICATING SEMICONDUCTOR DEVICES MINIMIZING UNDER-OXIDE REGROWTH

(75) Inventors: Kingsuk Maitra, Guilderland, NY (US); John Iacoponi, Wappingers Falls, NY (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 12/355,445

(22) Filed: Jan. 16, 2009

(51) Int. Cl.
*H01L 21/02* (2006.01)
(52) U.S. Cl. .................. 438/297; 438/299; 438/303; 438/306; 438/595; 257/E21.148; 257/E21.151; 257/E21.199; 257/E21.266; 257/E21.299; 257/E21.409; 257/E21.415; 257/E29.004; 257/E29.107; 257/E21.279
(58) Field of Classification Search ......... 438/297–306, 438/595; 257/E21.148, 151, 159, 335, 345, 257/409, 415, E29.004, 107, 117, 278–281
See application file for complete search history.

(56) References Cited

U.S. PATENT DOCUMENTS

| | | | | |
|---|---|---|---|---|
| 5,040,037 | A * | 8/1991 | Yamaguchi et al. | 257/347 |
| 5,116,771 | A * | 5/1992 | Karulkar | 438/163 |
| 5,908,313 | A * | 6/1999 | Chau et al. | 438/299 |
| 6,255,704 | B1 * | 7/2001 | Iwata et al. | 257/401 |
| 6,531,739 | B2 * | 3/2003 | Cable et al. | 257/347 |
| 6,690,043 | B1 * | 2/2004 | Usuda et al. | 257/194 |
| 6,773,970 | B2 * | 8/2004 | Komatsu | 438/149 |
| 7,307,273 | B2 * | 12/2007 | Currie | 257/18 |
| 7,335,545 | B2 * | 2/2008 | Currie | 438/197 |
| 2003/0181015 | A1 * | 9/2003 | Komatsu | 438/303 |
| 2005/0118769 | A1 * | 6/2005 | Kammler et al. | 438/303 |
| 2009/0039426 | A1 * | 2/2009 | Cartier et al. | 257/344 |
| 2009/0236595 | A1 * | 9/2009 | Atanackovic | 257/43 |
| 2009/0311836 | A1 * | 12/2009 | Cartier et al. | 438/163 |

* cited by examiner

*Primary Examiner*—Michael S Lebentritt
(74) *Attorney, Agent, or Firm*—Ingrassia Fisher & Lorenz, P.C.

(57) ABSTRACT

Methods for producing a semiconductor device are provided. In one embodiment, a method includes the steps of: (i) fabricating a partially-completed semiconductor device including a substrate, a source/drain region in the substrate, a gate stack overlaying the substrate, and a sidewall spacer adjacent the gate stack; (ii) utilizing an anisotropic etch to remove an upper portion of the sidewall spacer while leaving intact a lower portion of the sidewall spacer overlaying the substrate; (iii) implanting ions in the source/drain region; and (iv) annealing the semiconductor device to activate the implanted ions. The step of annealing is performed with the lower portion of the sidewall spacer intact to deter the ingress of oxygen into the substrate and minimize under-oxide regrowth proximate the gate stack.

18 Claims, 4 Drawing Sheets

METHODS FOR FABRICATING SEMICONDUCTOR DEVICES MINIMIZING UNDER-OXIDE REGROWTH

TECHNICAL FIELD

The present invention relates generally to semiconductor device manufacturing processes and, more particularly, to methods for fabricating a semiconductor device that reduces the occurrence of under-oxide regrowth.

BACKGROUND

The majority of present day integrated circuits (ICs) are implemented utilizing a plurality of interconnected field effect transistors (FETs), also referred to as metal oxide semiconductor field effect transistors (MOSFETs) or more simply MOS transistors. MOS transistors have traditionally been fabricated on bulk silicon wafers. Although many MOS transistors are still fabricated on bulk silicon wafers, MOS transistors are increasingly produced on semiconductor-on-insulator (SOI) substrates. A representative SOI substrate includes a thin layer of silicon overlaying an intermediate insulating layer, which is supported by a bulk wafer. The intermediate insulating layer typically comprises silicon oxide and is commonly referred to as a "buried oxide" or "BOX" layer. In certain instances, the silicon layer overlaying the BOX layer may be scaled down in proportion to the dimensions of other device parameters (e.g., gate length). When the overlaying silicon layer has a thickness less than approximately 25 nm, the SOI substrate is commonly referred to as an "extremely thin" SOI or "ETSOI" substrate.

Relative to MOS transistors produced on bulk wafers, MOS transistors produced on ETSOI substrates generally achieve lower junction capacitances and higher operational speeds. However, the thin overlaying silicon layer of the ETSOI substrate provides relatively limited space in which to form source and drain regions. For this reason, elevated or raised source/drain regions may be formed in and over the ETSOI substrate. To create raised source/drain regions on an ETSOI substrate, one or more disposable sidewall spacers are typically formed adjacent the gate stack. The disposable spacers can be formed by, for example, low pressure chemical vapor deposition of silicon nitride (SiN). After one or more pre-cleaning steps, a selective epitaxial growth process is performed to grow raised source/drain regions offset from the gate stack by the disposable spacers. A previously-deposited silicon nitride (SiN) cap prevents epitaxial growth over the gate stack. After ions are implanted into the raised source/drain regions, a hot phosphoric acid wet etch is performed to remove the disposable spacers. The hot phosphoric acid etch removes the disposable spacers in their entirety and, in so doing, creates a void in the overlaying silicon layer between each sidewall of the gate stack and the neighboring raised source/drain. The hot phosphoric acid etch also removes the silicon nitride cap overlaying the gate stack. Finally, an activation spike anneal is performed to activate and diffuse the ions implanted in the raised source/drain, as well as ions implanted during previous gate doping steps. Various additional steps are then performed (e.g., halo and extension implants, final spacer formation, laser activation anneal, etc.) to further complete the device.

Although generally satisfactory for producing an ETSOI semiconductor device, the above-described fabrication process is limited in certain respects. For example, during the activation spike anneal, the ingress of oxygen from the source/drain region may result in under-oxide regrowth near the interface between the metal gate stack and the overlaying silicon layer of the ETSOI substrate. In particular, the ingress of oxygen into the ETSOI substrate may result in the oxidation of the well region underlying the gate stack, as well as oxidation of the gate insulator included within the gate stack, especially if the gate insulator is formed from a high-k material. Oxidation of the gate insulator increases the gate insulator's thickness undesirably and negatively impacts the overall performance and scalability of the resulting ETSOI semiconductor device.

Accordingly, it would be desirable to provide methods for manufacturing a semiconductor device, such as an ETSOI semiconductor device, that minimizes or eliminates the occurrence of under-oxide regrowth during the activation spike anneal and other high temperature processing steps (e.g., selective epitaxial growth of the raised source drain regions). Furthermore, other desirable features and characteristics of the present invention will become apparent from the subsequent detailed description and the appended claims, taken in conjunction with the accompanying drawings and the foregoing technical field and background.

BRIEF SUMMARY

Methods for producing a semiconductor device are provided. In one embodiment, a method includes the steps of: (i) fabricating a partially-completed semiconductor device including a substrate, a source/drain region in the substrate, a gate stack overlaying the substrate, and a sidewall spacer adjacent the gate stack; (ii) utilizing an anisotropic etch to remove an upper portion of the sidewall spacer while leaving intact a lower portion of the sidewall spacer overlaying the substrate; (iii) implanting ions in the source/drain region; and (iv) annealing the semiconductor device to activate the implanted ions. The step of annealing is performed with the lower portion of the sidewall spacer intact to deter the ingress of oxygen into the substrate and minimize under-oxide regrowth proximate the gate stack.

BRIEF DESCRIPTION OF THE DRAWINGS

The present invention will hereinafter be described in conjunction with the following drawing figures, wherein like numerals denote like elements, and wherein.

DETAILED DESCRIPTION

The following Detailed Description is merely exemplary in nature and is not intended to limit the invention or the application and uses of the invention. Furthermore, there is no intention to be bound by any expressed or implied theory presented in the preceding Technical Field, Background, Brief Summary, or the following Detailed Description. Although the term "MOS device" properly refers to a device having a metal gate electrode and an oxide gate insulator, that term will be used throughout to refer to any semiconductor device that includes a conductive gate electrode that is positioned over a gate insulator (whether oxide or other insulator), which is, in turn, positioned over a semiconductor substrate. Furthermore, various steps in the manufacture of MOS transistors are well-known and, in the interests of brevity, will only be mentioned briefly herein or will be omitted entirely without providing the well-known process details FIGS. 1-12 are simplified cross-sectional views illustrating a series of fabrication steps that can be performed to produce an exemplary semiconductor device 20 (shown at various stages of completion in FIGS. 1-12) while reducing the occurrence of under-oxide regrowth in accordance with exemplary embodiments. For clarity, semiconductor device 20 is illustrated in FIGS. 1-12 and described below as a single P-type or N-type MOS transistor. However, it will be appreciated that semiconductor device 20 will typically include numerous transistors in actual embodiments, including complementary MOS transistors. Furthermore, although semiconductor device 20 is fabricated utilizing extremely thin silicon-on-insulator (ETSOI) substrate in the following example, semiconductor device 20 may also be produced utilizing other substrates in alternative embodiments (e.g., a bulk silicon wafer).

Figure 1:
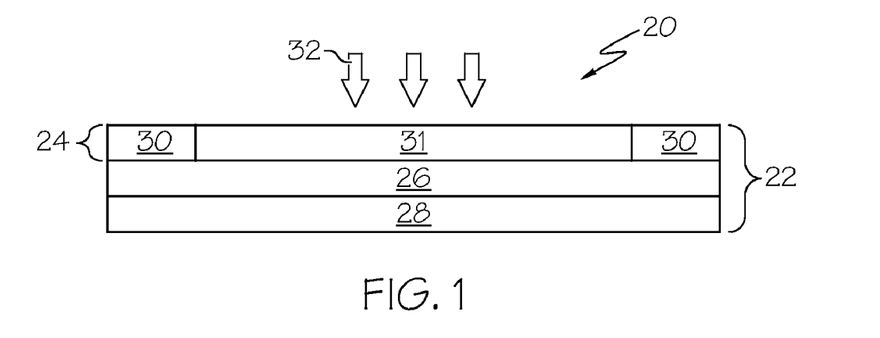
FIGS. 1-12 are simplified cross-sectional views illustrating various steps of a fabrication process for producing a semiconductor device while minimizing or eliminating the occurrence of under-oxide regrowth in accordance with exemplary embodiments.

Referring initially to FIG. 1, an exemplary method of manufacture commences with the provision of a silicon substrate 22. As appearing herein, the term "silicon substrate" encompasses the relatively pure silicon materials typically used in the semiconductor industry as well as silicon admixed with other elements, such as germanium and the like. As noted above, silicon substrate 22 can be a bulk silicon wafer. However, as indicated in FIG. 1, silicon substrate 22 preferably assumes the form of an SOI wafer including an upper silicon layer 24 overlaying an intermediate insulating layer 26 (also commonly referred to as a "buried oxide" or "BOX" layer), which is supported by a silicon carrier wafer 28. Still more preferably, silicon substrate 22 assumes the form of an ETSOI substrate; i.e., an SOI substrate wherein the thickness of overlaying silicon layer 24 is less than approximately 25 nm.

One or more electrical isolation features are formed within semiconductor substrate 22 utilizing a known electrical isolation technique, such as the localized oxidation of silicon. In the illustrated exemplary embodiment, a shallow trench isolation (STI) formation technique is utilized to form STI features 30 within overlaying silicon layer 24. STI features 30 may be formed by first etching a shallow trench into overlaying silicon layer 24, growing a thermal oxide liner within the etched trench, and subsequently depositing an oxide liner into the trench and over the thermal oxide liner. After the formation of STI features 30, a well region 31 is created within overlaying silicon layer 24 and within the boundaries of STI feature 30. If well region 31 is an N-type well region, well region 31 can be formed in overlaying silicon layer 24 via the implantation of arsenic or phosphorus ions (indicated in FIG. 1 by arrows 32). Alternatively, well region 31 can be a P-type well region formed in overlaying silicon layer 24 via the implantation of boron ions.

Figure 2:
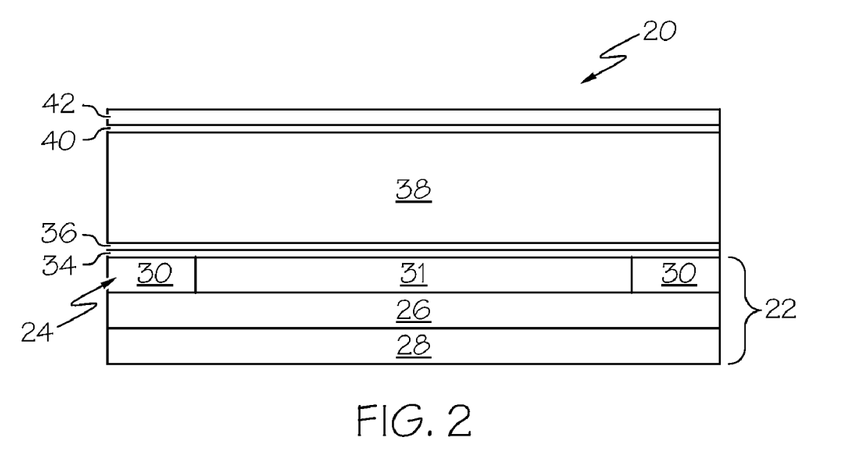

FIG. 2 illustrates partially-completed semiconductor device 20 after several layers of materials have been deposited on or otherwise formed over the upper surface of silicon substrate 22. These layers include: (i) a gate insulator layer 34 formed over overlaying silicon layer 24, (ii) a metal gate layer 36 formed over gate insulator layer 34, (iii) a gate electrode layer 38 formed over metal gate layer 36, (iv) an oxide capping layer 40 formed over gate electrode layer 38, and (v) a nitride capping or hard mask layer 42 formed over oxide capping layer 40. The sequential formation of layers 34, 36, 38, 40, and 42 is described, in turn, below.

Gate insulator layer 34 can comprise any material suitable for insulating metal gate layer 36 from well region 31. For example, gate insulator layer 34 can comprise silicon dioxide thermally grown on the upper surface of silicon layer 24 by heating silicon substrate 22 in an oxidizing ambient. This notwithstanding, it is preferred that gate insulator layer 34 comprises a high-k dielectric material deposited over overlaying silicon layer 24 utilizing, for example, chemical vapor deposition (CVD), low pressure chemical vapor deposition (LPCVD), or plasma enhanced chemical vapor deposition (PECVD). A non-exhaustive list of high-k dielectric materials that can be deposited to form gate insulator layer 34 includes hafnium dioxide ($HfO_2$), hafnium silicon oxide (HfSiO), titanium dioxide ($TiO_2$), tantalum pentoxide ($Ta_2O_5$), zirconium dioxide ($ZrO_2$), and various other compounds that have a relatively high dielectric constant as compared to silicon dioxide or silicon oxynitride. The thickness of gate insulator layer 34 will vary depending upon the desired performance characteristics of semiconductor device 20; however, it is generally preferred that gate insulator layer 34 is deposited to a thickness less than approximately 10 nm and, more preferably, to a thickness less than approximately 5 nm.

Metal gate layer 36 is deposited over gate insulator layer 34 utilizing a conventional deposition technique, such as chemical vapor deposition. A non-exhaustive list of metals suitable for use in the formation of metal gate layer 36 includes titanium nitride (TiN), tantalum nitride (TaN), hafnium silicide (HfSi), and tantalum carbide (TaC). Metal gate layer 36 is preferably deposited to a thickness of approximately 2 nm to approximately 10 nm. After the deposition of metal gate layer 36 over gate insulator layer 34, gate electrode layer 38 is formed over metal gate layer 36. Gate electrode layer 38 can be deposited as undoped polycrystalline silicon that is subsequently impurity doped via ion implantation; however, gate electrode layer 38 is preferably deposited as polycrystalline silicon doped in situ. In one specific implementation, gate electrode layer 38 comprises polycrystalline silicon deposited utilizing LPCVD and a hydrogen-silane reduction. Gate electrode layer 38 is preferably deposited to a thickness of approximately 10 nm to approximately 100 nm.

Oxide capping layer 40 is next deposited overlaying gate electrode layer 38. Oxide capping layer 40 can be deposited via LPCVD utilizing silane ($SiH_4$) or tetraethylorthosilicate $Si(OC_2H_5)_4$ (commonly referred to as "TEOS"). Alternatively, oxide capping layer 40 can be deposited via PECVD utilizing silane ($SiH_4$) and either oxygen ($O_2$) or nitrous oxide ($N_2O$) as reactants. Oxide capping layer 40 is preferably deposited to thickness of less than approximately 10 nm and, still more preferably, to a thickness between approximately 1 nm and approximately 2 nm. Lastly, after the deposition of oxide capping layer 40, nitride capping layer 42 is formed. In one embodiment, nitride capping layer 42 comprises silicon nitride ($Si_3N_4$) deposited over oxide capping layer 40 utilizing a low temperature deposition process; e.g., to form nitride capping layer 42, PECVD can be performed utilizing silane ($SiH_4$) and ammonia ($NH_3$) or nitrogen ($N_2$) in the presence of an argon (Ar) plasma. Nitride capping layer 42 is preferably deposited to have a thickness in the range of approximately 10 nm to approximately 50 nm.

Figure 3:
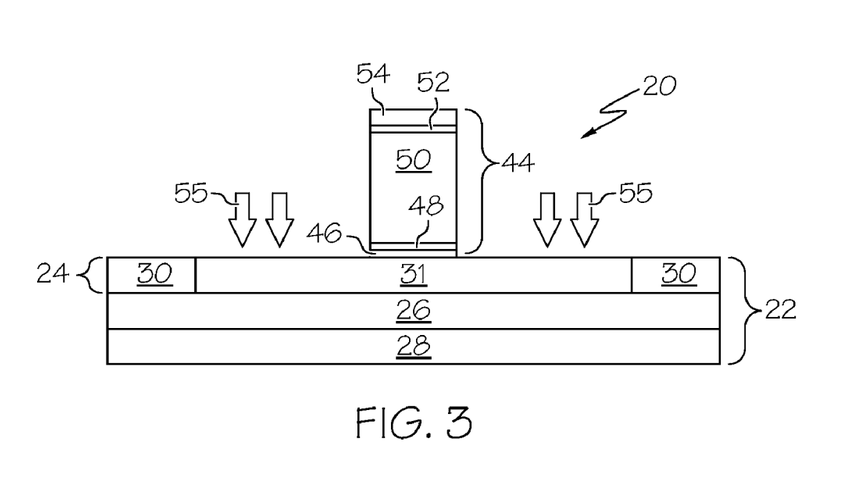

FIG. 3 illustrates partially-completed semiconductor device 20 after layers 34, 36, 38, 40, and 42 have been patterned and etched to define a gate stack 44. In the illustrated exemplary embodiment, gate stack 44 includes a metal component (i.e., metal gate 48 described below) and may consequently be referred to as "metal gate stack 44" herein; however, it should be understood that the gate stack of semiconductor device 20 may not include a metal component in alternative embodiments. In the example shown in FIG. 3, metal gate stack 44 includes: (i) a gate insulator 46, (ii) a metal gate 48, (iii) a gate electrode 50, (iv) an oxide cap 52, and (v) a nitride cap 54. In one embodiment, nitride cap 54 is formed by photolithography and etching (e.g., reactive ion etching) of nitride capping layer 42. Nitride cap 54 serves as a hard etch mask as oxide capping layer 40, gate electrode layer 38, metal gate layer 36, and gate insulator layer 34 are etched to define oxide cap 52, gate electrode 50, metal gate 48, and gate insulator 46, respectively. For this reason, nitride cap 54 may also be generically referred to as "hard etch mask 54" herein. During each etching process, a chemistry selective to the layer being etched is utilized to help preserve the bulk of nitride cap 54. For example, when etching oxide capping layer 40, gate electrode layer 38, and gate insulator layer 34, a carbon hydro-trifluoride ($CHF_3$), tetrafluoromethane ($CF_4$), and/or sulfur hexafluoride ($SF_6$) chemistry can be employed as appropriate; and, when etching metal gate layer 36, a chloride ($Cl^-$) and/or bromous acid ($HBrO_2$) chemistry may be utilized.

Figure 4:
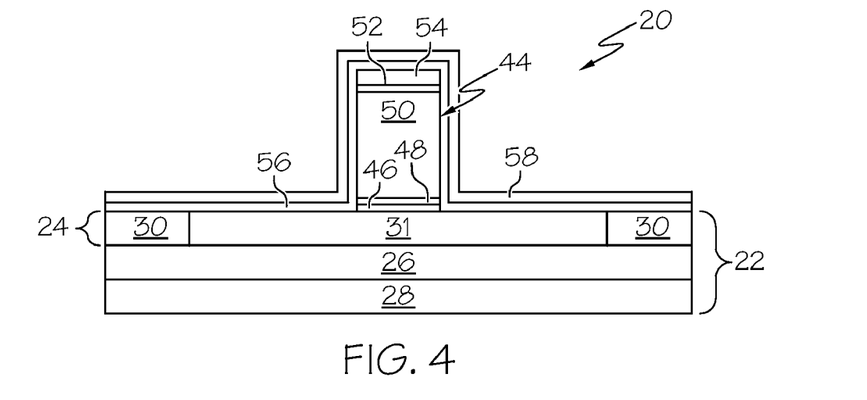

FIG. 4 illustrates partially-completed semiconductor device 20 after the formation of a nitride liner 56 and an oxide liner 58 over semiconductor substrate 22. Nitride liner 56 is first formed over overlaying silicon layer 24 of semiconductor substrate 22 utilizing a conventional deposition technique. Nitride liner 56 preferably comprises silicon nitride (SiN) deposited to a thickness of approximately 3 to approximately 10 nm. After the formation of nitride liner 56 over silicon layer 24, oxide liner 58 is formed over nitride liner 56. Again, oxide liner 58 can be deposited utilizing various known deposition techniques. Oxide liner 58 preferably comprises a high temperature oxide deposited to a thickness of approximately 20 nm to approximately 100 nm.

Figure 5:
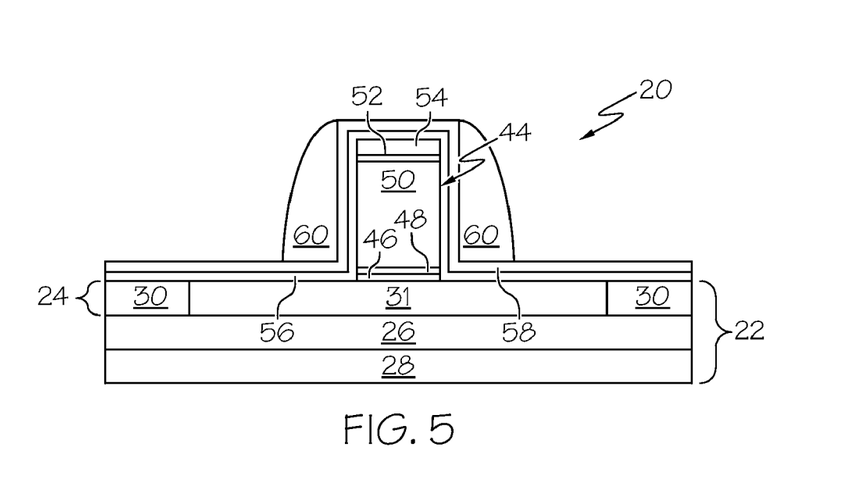

FIG. 5 illustrates partially-completed semiconductor device 20 after first and second sidewall spacers 60 have been formed adjacent opposing sidewalls of metal gate stack 44. In accordance with one exemplary technique, a spacer-forming material (e.g., $SiO_2$, SiN, or an ultra-low k material) is deposited over oxide liner 58 proximate metal gate stack 44 to form sidewall spacers 60. In this exemplary case, the spacer-forming material can be deposited to a thickness of approximately 15 nm utilizing LPCVD. The spacer-forming material is then anisotropically etched utilizing, for example, a reactive ion etching (RIE) technique employing a carbon hydro-trifluoride ($CHF_3$), tetrafluoromethane ($CF_4$), or sulfur hexafluoride ($SF_6$) chemistry. Although partially-completed semiconductor device 20 is illustrated as including only a single set of sidewall spacers 60, it will be readily appreciated that multiple sidewall spacers can be utilized in the fabrication of semiconductor device 20.

Figure 6:
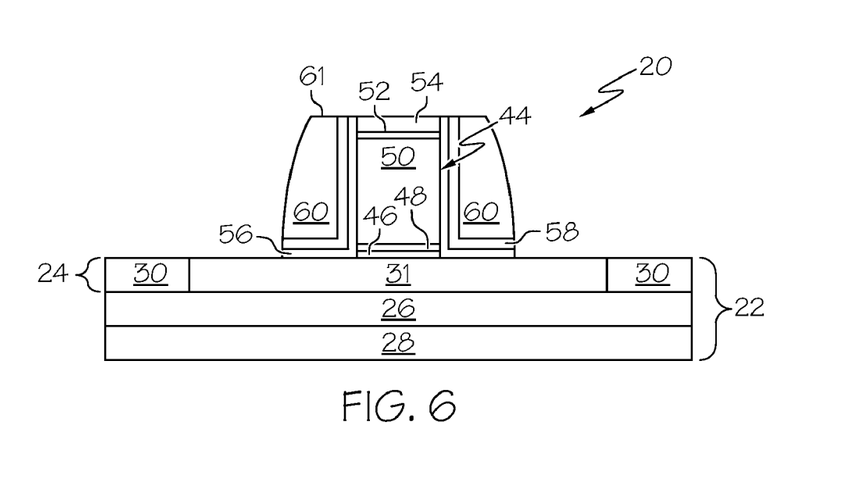

FIG. 6 illustrates partially-completed semiconductor device 20 after a series of epitaxial pre-cleanings steps. In particular, sequential etches are performed to remove the exposed areas of oxide liner 58 and of nitride liner 56 not protected by sidewall spacers 60. The exposed portion of oxide liner 58 can be removed utilizing a wet etch having an oxide-selective chemistry, such as an hydrofluoric (HF) acid. Similarly, the exposed portion of nitride liner 56 can be subsequently removed utilizing a etchant having a nitride-selective chemistry, such as carbon hydro-trifluoride ($CHF_3$), tetrafluoromethane ($CF_4$), or sulfur hexafluoride ($SF_6$) chemistry. In embodiments wherein nitride liner 56 and sidewall spacers 60 each comprise a similar material (e.g., silicon nitride), nitride liner etching may also result in the removal of an upper portion of sidewalls spacers 60 as generally shown in FIG. 6 at 61.

Figure 7:
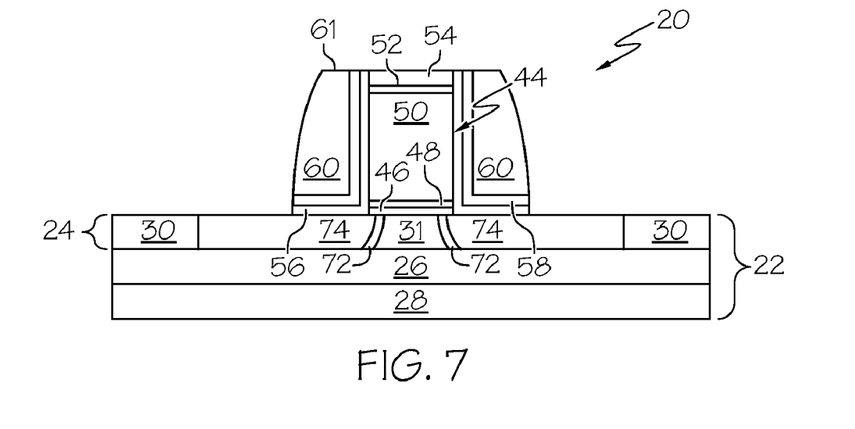

In contrast to certain known ETSOI fabrication processes, extension source/drain implants and possibly halo implants are preferably performed prior to epitaxial growth of the raised source/drain regions. FIG. 7 illustrates partially-completed semiconductor device 20 after halo and extension source/drain implantation. As shown in FIG. 7, extension implantation result in the creation of source/drain extensions 74 within the upper layer of substrate 22 proximate opposing end portions of well region 31; and halo implantation results in the creation of halo regions 72 between source/drain extensions 74 and well region 31. An annealing process (e.g., a laser activation anneal) is later performed to active source/drain extensions 74 and halo regions 72. Notably, when semiconductor substrate 22 assumes the form of an ETSOI substrate, the laser activation anneal activates, but generally does not diffuse, source/drain extensions 74 and halo regions 72. Halo doping permits the threshold voltage of semiconductor device 20 to be fine tuned. This notwithstanding, halo doping may not be performed, and therefore semiconductor device 20 may not include halo regions 72, in alternative embodiments.

Figure 8:
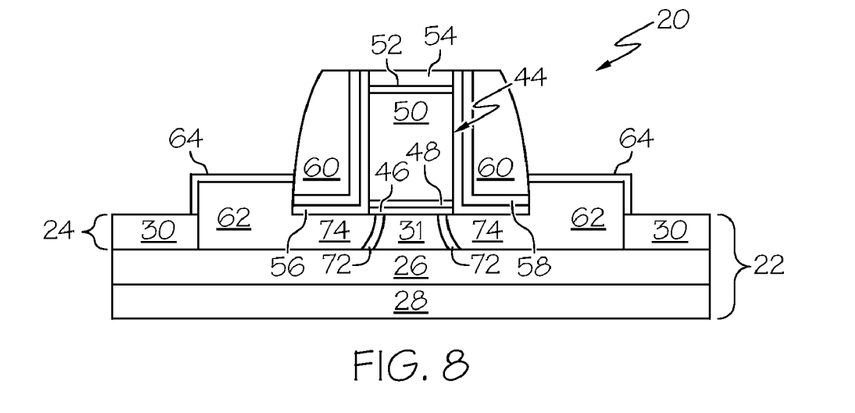

FIG. 8 illustrates partially-completed semiconductor device 20 after raised source/drain regions 62 have been epitaxially grown adjacent sidewall spacers 60. A selective epitaxial growth (SEG) is utilized to grow raised source/drain regions 62 on the exposed areas of silicon substrate 22 and proximate the ends of the channel formed within substrate 22. Sidewall spacers 60 and nitride cap 54 prevent epitaxial growth over metal gate stack 44. If semiconductor device 20 is a PMOS transistor, embedded epitaxial silicon germanium (eSiGe) or like material can be utilized to apply a compressive longitudinal stress to the channel underlying metal gate stack 44 and thereby increase carrier mobility. If semiconductor device 20 is a NMOS transistor, silicon carbon (eSiC) or like material can be utilized to apply a tensile longitudinal stress to the channel to increase carrier mobility. Notably, the epitaxial growth process is performed with sidewalls spacers 60 in place over semiconductor substrate 20. Should the epitaxial growth process be performed at a relatively high temperature, the presence of sidewall spacers 60 prevents the ingress of oxygen into substrate 20 during high temperature processing. By blocking the ingress of oxygen into substrate 20 during high temperature processing, under-oxide regrowth proximate metal gate stack 44 is deterred thereby helping to maintain the performance characteristics and scalability of semiconductor device 20 as described below. After the formation of raised source/drain regions 62, a thin oxide layer 64 is formed overlaying regions 62. In one embodiment, low temperature CVD is utilized to deposit thin oxide layer 64 to a thickness of approximately 3 nm to approximately 10 nm.

Figure 9:
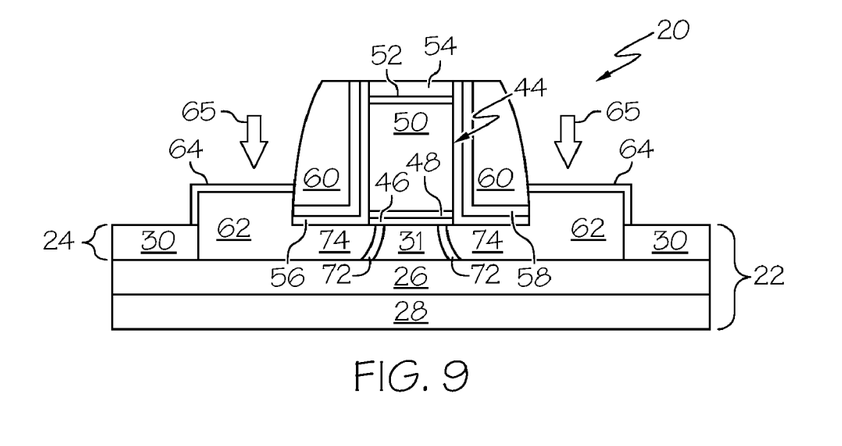

FIG. 9 illustrates partially-completed semiconductor device 20 after a deep implantation into raised source/drain regions 62. During this step, impurity dopant ions are implanted into the surface of semiconductor substrate 22 (indicated in FIG. 9 by arrows 65). If semiconductor device 20 is an NMOS transistor, phosphorous or arsenic ions can be implanted during deep source/drain implantation. If semiconductor device 20 is instead a PMOS transistors, boron ions can be implanted. In one embodiment, the acceleration voltage utilized for an NMOS device ranges from about 10 to about 30 keV; and the acceleration utilized for a PMOS device ranges from about 0.5 to about 3 keV. The dose utilized for either an NMOS device or a PMOS devices may range from about $1 \times 10^{15}$ $cm^{-2}$ to about $5 \times 10^{15}$ $cm^{-2}$. The deep source/drain implants self-align to metal gate stack 44 and sidewall spacers 60, which collectively serve as an implant mask.

In certain conventional fabrication processes, a hot phosphoric acid wet etch is utilized remove disposable spacers after deep source/drain ion implantation. As will be readily appreciated, the hot phosphoric acid wet etch process is isotropic and removes the disposable spacers in their entirety. An activation spike anneal is then performed to activate and diffuse the ions implanted in the raised source/drain regions. As previously explained, oxygen ingresses into the semiconductor substrate during the activation spike anneal and thus causes under-oxide regrowth to occur near the interface between the metal gate stack and the ETSOI substrate. Under-oxide regrowth results in an undesired increase in the gate insulator's thickness and negatively impacts the overall performance and scalability of the resulting ETSOI semiconductor device. As described below, embodiments of the inventive fabrication method employ a reactive ion etch to remove an upper portion of sidewall spacers 60 while leaving intact lower portions of sidewall spacers 60. The lower portions of sidewall spacers 60 physically block the ingress of oxygen into semiconductor substrate 22 and, thus, minimize under-oxide regrowth during annealing and other high temperature processing steps.

Figure 10:
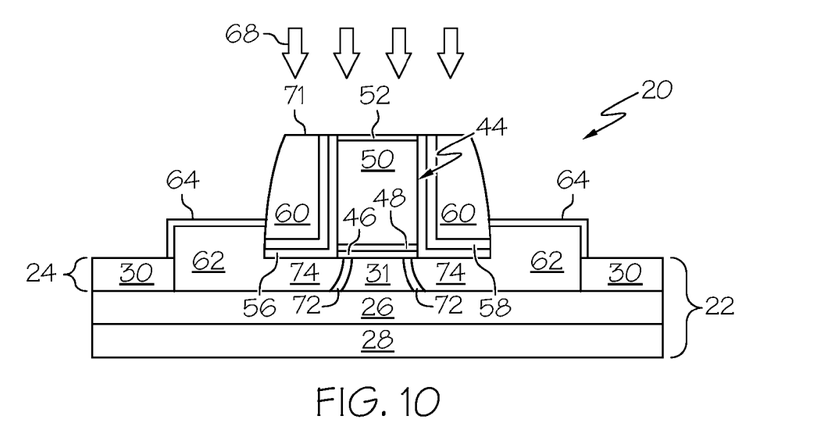

Referring now to FIG. 10, partially-completed semiconductor device 20 is illustrated during a reactive ion etch (RIE) process (generally indicated in FIG. 10 by arrows 68). The RIE process is performed utilizing a plasma chemistry selective to nitride cap 54. Suitable plasma chemistries include various chlorine- and fluorine-based chemistries, such as carbon hydro-trifluoride ($CHF_3$), tetrafluoromethane ($CF_4$), or sulfur hexafluoride ($SF_6$) chemistries. As will be appreciated by comparing FIG. 10 to FIG. 9, the RIE process results in the removal of nitride cap 54, but also in the partial removal of sidewall spacers 60. In contrast to a traditional hot phosphoric acid etch, the RIE process is a dry anisotropic etch that can be controlled so as to not remove sidewall spacers 60 in their entirety. Instead, as indicated in FIG. 10 at 71, the RIE process removes only an upper portion of sidewall spacers 60. The RIE process thus leaves intact a lower portion of each sidewall spacer 60 generally residing between metal gate stack 44 and the neighboring source/drain regions 62. Ideally, the RIE process is performed such that depth to which sidewall spacers 60 are etched is substantially equivalent to the thickness of nitride cap 54; however, this may not always be practicable due to the disparate shapes of sidewall spacers 60 and nitride cap 54. It is thus generally preferred that the depth to which sidewall spacers 60 are etched is substantially equivalent to the thickness of nitride cap 54 ±2 nm.

Figure 11:
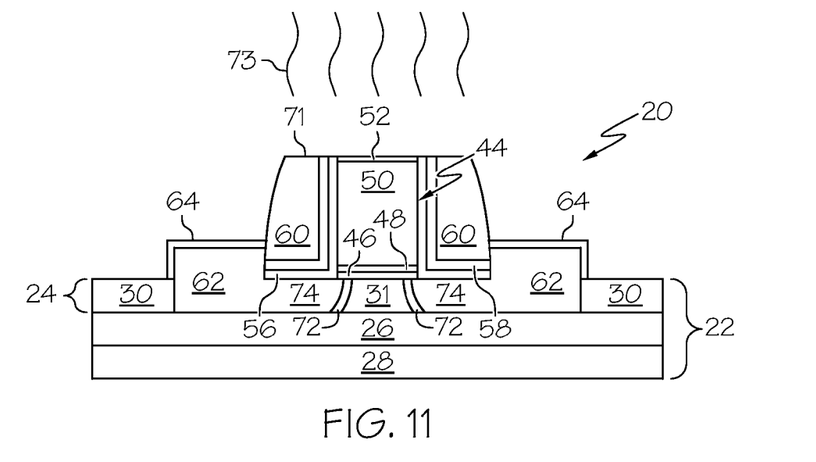

FIG. 11 illustrates partially-completed semiconductor device 20 during an annealing process (indicated generically in FIG. 11 by heat lines 73). The annealing process, in this case an activation spike anneal, is performed to activate the ions implanted in source/drain regions 62 during the source/drain deep implantation step described above in conjunction with FIG. 9. As shown in FIG. 11, and as a point of emphasis, the annealing process is performed with the lower portion of sidewall spacers 60 intact. This remaining portion of sidewall spacers 60 physically blocks the ingress of oxygen into semiconductor substrate 22. Oxygen is thus generally unable to reach metal gate stack 44 during annealing and oxidation of high-k gate insulator 46 and well region 31 is generally prevented. Under-oxide regrowth is consequently minimized or eliminated thereby helping to optimize the scalability and performance of semiconductor device 20.

Figure 12:
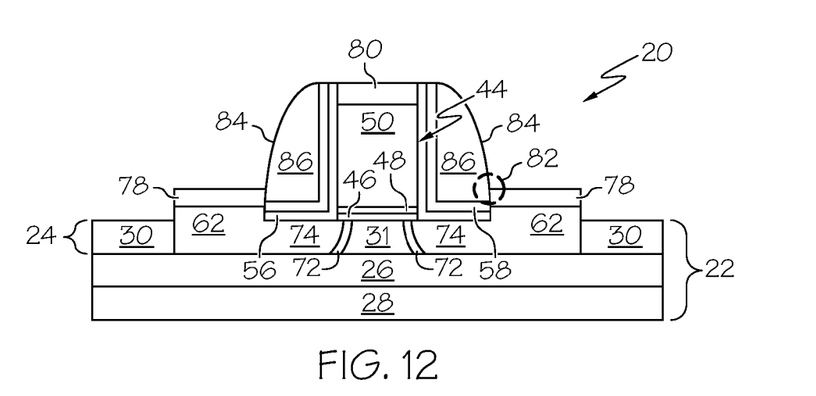

FIG. 12 illustrates partially-completed semiconductor device 20 after the performance of further processing steps. As can be seen in FIG. 12, oxide cap 52 and oxide layers 64 have been removed via an etching process, and multiple silicide layers have been formed within the uppermost portions of semiconductor device 20. More specifically, silicide layers 78 have been formed within an upper portion raised source/drain regions 62, and a silicide layer 80 has been formed within an upper portion of gate electrode 50. In one option, silicide layers 78, 80 are formed by depositing a layer of silicide-forming metal onto the surface of semiconductor substrate 22 and over gate stack 44. The silicide-forming metal is then heated utilizing, for example, one or more rapid thermal annealing (RTA) steps. Preferred silicide-forming metals include cobalt and nickel, although other silicide-forming metals may be employed (e.g., rhenium, ruthenium, palladium, etc.). The silicide-forming metal can be deposited, for example, by sputtering to a thickness of approximately 5 nm to approximately 30 nm. Any silicide-forming metal that is not in contact with exposed silicon (e.g., the silicide-forming metal that is deposited on sidewall sidewalls spacers 76) does not react during the RTA to form a silicide and can subsequently be removed via wet etching in a $H_2O_2/H_2SO_4$ or $HNO_3/HCl$ solution. Silicide layers 78, 80 serve to increase conductivity and provide a convenient contact point for raised source/drain region 62 and gate electrode 50, respectively. Additional steps are performed to complete processing of semiconductor device 20 (e.g., the deposition of a second interlayer dielectric, further etching steps to provide vias to the source and drain regions, deposition of metal plugs, etc); however, such steps are well-known in the industry and are not described herein in the interests of concision.

Relative to semiconductor devices produced utilizing the conventional processes described above, semiconductor device 20 has a unique structural feature. As may be appreciated by referring to FIG. 12 at 82, the outer sidewall 84 of each final sidewall spacer 86 laterally aligns with, but does not overlap, its neighboring source/drain region 62. Stated differently, each final sidewall spacer 86 does not cover the upper surface of its neighboring raised source/drain region 62. By comparison, in semiconductor devices produced utilizing the above-described conventional process, the final spacers overlap with and cover the upper surface of the inner edge of the raised source/drain regions.

It should thus be appreciated that there has been provided a exemplary method for manufacturing a semiconductor device that minimizes or eliminates the occurrence of under-oxide regrowth during activation spike anneal and other high temperature processing steps (e.g., selective epitaxial growth of raised source/drain regions). It should further be appreciated that the above-described exemplary fabrication process is especially well-suited for fabricating semiconductor devices utilizing extremely thin SOI substrates; i.e., substrates wherein the overlaying silicon layer has a thickness of approximately 25 nm or less. Although utilized to produce a single MOS transistor in the foregoing example, embodiments of the fabrication process can easily be adapted to yield multi-transistor devices including CMOS devices. Furthermore, embodiments of the inventive method are equally applicable to the production of semiconductor devices employing alternate architectures (e.g., FinFETs, tri-gates, etc.) and alternative channel materials (e.g., III-V channel and germanium channel materials).

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for producing a semiconductor device, the method comprising:
   fabricating a partially-completed semiconductor device including a substrate, a source/drain region in the substrate, a gate stack overlaying the substrate, and a sidewall spacer adjacent the gate stack;
   utilizing an anisotropic etch to remove an upper portion of the sidewall spacer while leaving intact a lower portion of the sidewall spacer overlaying the substrate;
   implanting ions in the source/drain region;
   implanting ions into the substrate to form a source/drain extension; and epitaxially growing a raised source/drain region adjacent the sidewall spacer, the step of epitaxially growing a raised source/drain region performed after the step of implanting ions into the substrate; and
   annealing the semiconductor device to activate the implanted ions, the step of annealing performed with the lower portion of the sidewall spacer intact to deter the ingress of oxygen into the substrate and minimize underoxide regrowth proximate the gate stack.

2. A method according to claim 1 wherein the step of utilizing an anisotropic etch comprises performing a reactive ion etch to remove the upper portion of the sidewall spacer.

3. A method according to claim 2 wherein the step of fabricating a partially-completed semiconductor device comprises forming the gate stack to include a hard etch mask.

4. A method according to claim 3 wherein the step of forming the gate stack comprises:
   forming a gate insulator layer, a metal gate layer over the gate insulator layer, a gate electrode layer over the metal gate layer, and a nitride capping layer over the metal gate layer; and
   etching the gate insulator layer, the metal gate layer, the gate electrode layer, and the nitride layer to define a gate insulator, a metal gate, a gate electrode, and the hard etch mask, respectively.

5. A method according to claim 4 wherein the step of forming the gate stack further comprises:
   forming an oxide capping layer intermediate the gate electrode layer and the nitride capping layer; and
   etching the oxide capping layer to define an oxide cap.

6. A method according to claim 5 wherein the step of performing a reactive ion etch comprises removing the nitride cap to expose the oxide cap.

7. A method according to claim 6 wherein the sidewall spacer comprises silicon nitride, and wherein the step of performing a reactive ion etch comprises exposing the sidewall spacer and the nitride cap to an etchant selective to silicon nitride.

8. A method according to claim 7 wherein the etchant is selected from the group consisting of fluorine-based chemistries and chlorine-based chemistries.

9. A method according to claim 1 wherein the step of fabricating a partially-completed semiconductor device comprises providing an extremely thin silicon-on-insulator (ETSOI) substrate including an overlaying silicon layer having a thickness less than approximately 25 nm.

10. A method according to claim 1 wherein the step of fabricating a partially-completed semiconductor device further comprises:
    depositing a nitride liner over the ETSOI substrate and the gate stack;
    depositing an oxide liner over the nitride liner; and
    forming the sidewall spacer adjacent the gate stack and over the nitride liner and the oxide liner.

11. A method according to claim 10 further comprising performing an epitaxial pre-clean step of remove the exposed portions of the nitride liner and the oxide liner.

12. A method according to claim 1 further comprising producing a final sidewall spacer having a sidewall that generally laterally aligns with the raised source/drain region.

13. A method for producing a semiconductor device, the method comprising:
    fabricating a partially-completed semiconductor device including an extremely thin silicon-on-insulator (ETSOI) substrate, a source/drain region in the ETSOI substrate, a gate stack overlaying the substrate and including a hard etch mask, and a sidewall spacer adjacent the gate stack;
    utilizing a reactive ion etch to remove the hard etch mask and an upper portion of the sidewall spacer while leaving intact a lower portion of the sidewall spacer overlaying the substrate;
    implanting ions in the source/drain region;
    implanting ions into the ETSOI substrate to form a source/drain extension; and epitaxially growing a raised source/drain region adjacent the sidewall spacer, the step of epitaxially growing a raised source/drain region performed after the step of implanting ions into the substrate; and
    annealing the semiconductor device to activate the implanted ions, the step of annealing performed with the lower portion of the sidewall spacer intact to deter the ingress of oxygen into the substrate and minimize underoxide regrowth proximate the gate stack.

14. A method according to claim 13 wherein the step of fabricating a partially-completed comprises:
    forming a gate insulator layer, a metal gate layer over the gate insulator layer, a gate electrode layer over the metal gate layer, an oxide capping layer over the metal gate layer, and a nitride capping layer over the oxide capping layer; and
    etching the gate insulator layer, the metal gate layer, the gate electrode layer, and the nitride layer to define a gate insulator, a metal gate, a gate electrode, an oxide cap, and the hard etch mask, respectively.

15. A method according to claim 14 wherein the sidewall spacer and the nitride cap each comprise silicon nitride, and wherein the step of performing a reactive ion etch comprises exposing the sidewall spacer and the nitride cap to an etchant selective to silicon nitride.

16. A method according to claim 15 further comprising producing a final sidewall spacer having a sidewall that generally laterally aligns with the raised source/drain region but generally does not overlap the upper surface of the raised source/drain region.

17. A method for producing a semiconductor device, the method comprising:
    fabricating a partially-completed semiconductor device including an extremely thin silicon-on-insulator (ETSOI) substrate, a gate stack on the ETSOI substrate including a hard etch stop, a sidewall spacer adjacent the gate stack, and a raised source/drain region adjacent the sidewall spacer;
    utilizing reactive ion etch to remove: (i) the hard etch stop, and (ii) a first portion of the sidewall spacer proximate;
    implanting ions in the source/drain region;
    implanting ions into the ETSOI substrate to form a source/drain extension; and epitaxially growing a raised source/drain region adjacent the sidewall spacer, the step of epitaxially growing a raised source/drain region performed after the step of implanting ions into the substrate; and annealing the semiconductor device to activate the implanted ions;

wherein the step of utilizing a reactive ion etch is performed such that a second portion of the sidewall spacer is left intact between the raised source/drain and the gate stack to deter the ingress of oxygen into the gate stack and minimize under-oxide regrowth during annealing.

18. A method according to claim 17 wherein the step of fabricating comprises forming the gate stack such that the hard etch stop comprises silicon nitride.

* * * * *